United States Patent [19]

Townsend

[11] Patent Number: 5,649,831
[45] Date of Patent: Jul. 22, 1997

[54] PRINTED CIRCUIT BOARD EDGE CONNECTOR INCLUDING LATCHING AND EJECTMENT MECHANISM

[75] Inventor: Peter K. Townsend, Camp Hill, Pa.

[73] Assignee: Berg Technology, Inc., Reno, Nev.

[21] Appl. No.: 367,730

[22] Filed: Jan. 3, 1995

[51] Int. Cl.$^6$ .................................................. H01R 13/62
[52] U.S. Cl. .................................................. 439/157; 439/328
[58] Field of Search .................................. 439/152–160, 439/372, 358, 328

[56] References Cited

U.S. PATENT DOCUMENTS

| | | | |
|---|---|---|---|
| 4,070,081 | 1/1978 | Takahashi | 339/91 R |
| 4,579,411 | 4/1986 | Cobaugh et al. | 339/75 MP |
| 4,698,024 | 10/1987 | Maxwell | 439/160 |
| 4,917,624 | 4/1990 | Yu | 439/328 |
| 4,990,097 | 2/1991 | Billman et al. | 439/160 |
| 5,074,800 | 12/1991 | Sasao et al. | 439/157 |
| 5,167,517 | 12/1992 | Long | 439/160 |
| 5,211,568 | 5/1993 | Yamada et al. | 439/157 |
| 5,302,133 | 4/1994 | Tondreault | 439/157 |
| 5,470,240 | 11/1995 | Suzuki | 439/153 |

*Primary Examiner*—David L. Pirlot
*Attorney, Agent, or Firm*—Daniel J. Long, Esq.; M. Richard Page, Esq.

[57] ABSTRACT

Disclosed is an insertion and ejection printed circuit board edge connector assembly. A circuit board fits into a slot in an elongated housing, and at each end of the housing there is an ejectment mechanism having an upper engagement arm and a lateral engagement arm which is pivotally connected to the housing at a point between the engagement and ejectment arm. The engagement arm is fixed to one end of the circuit board by a flexible latch which may be disengaged to allow the ejectment arm to pivot upwardly to eject the circuit board.

13 Claims, 4 Drawing Sheets

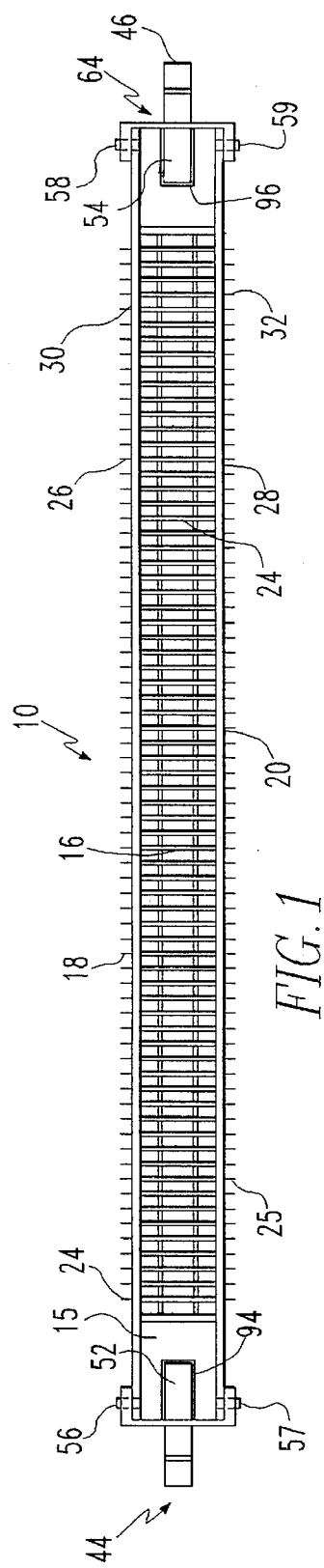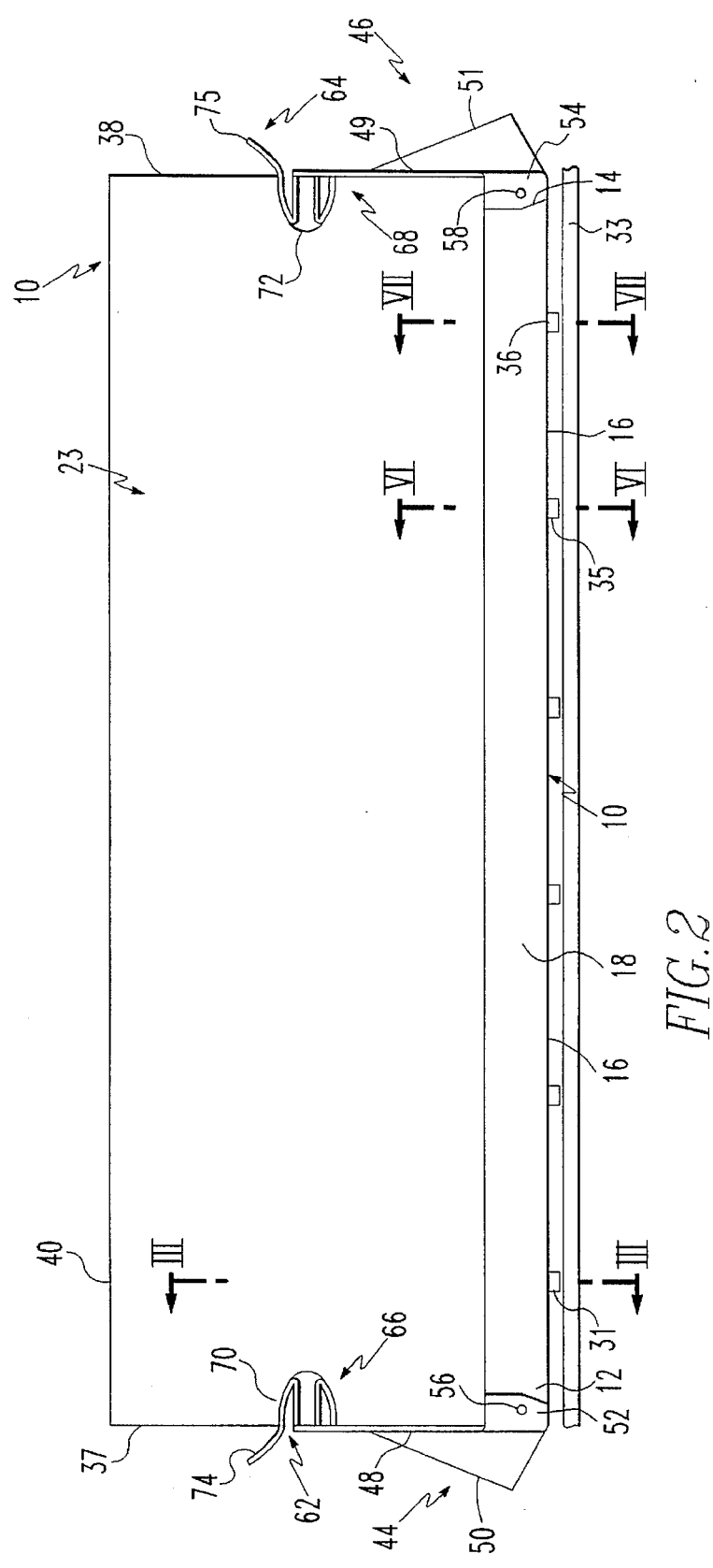

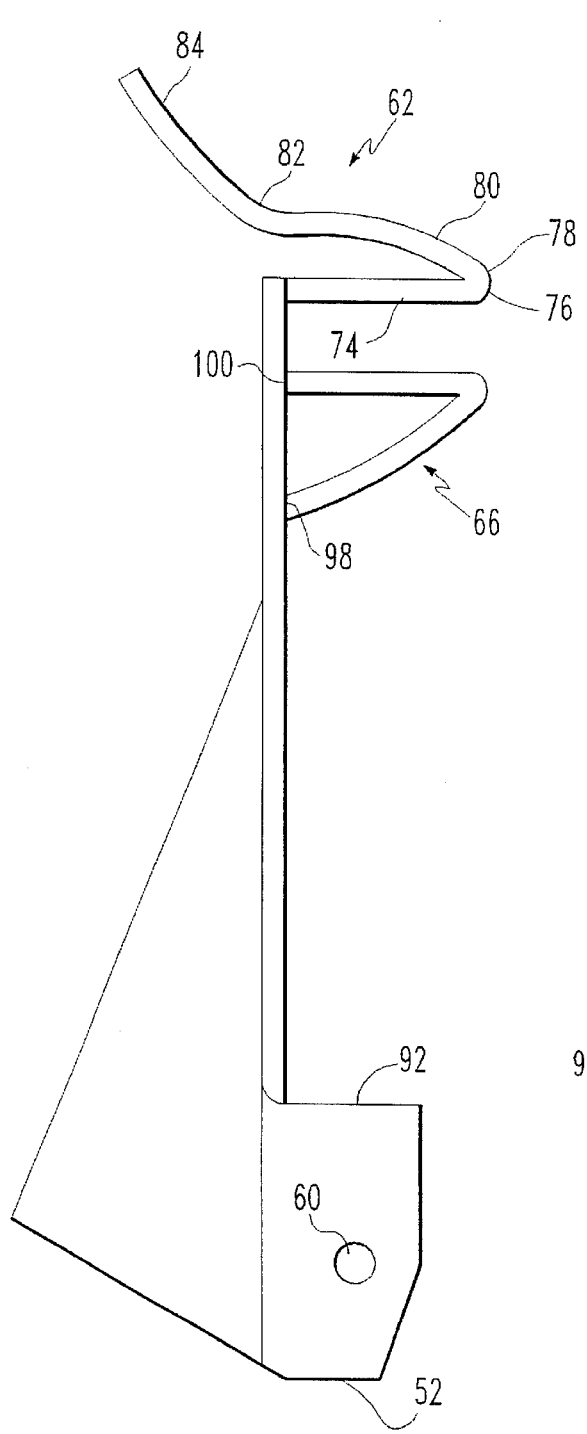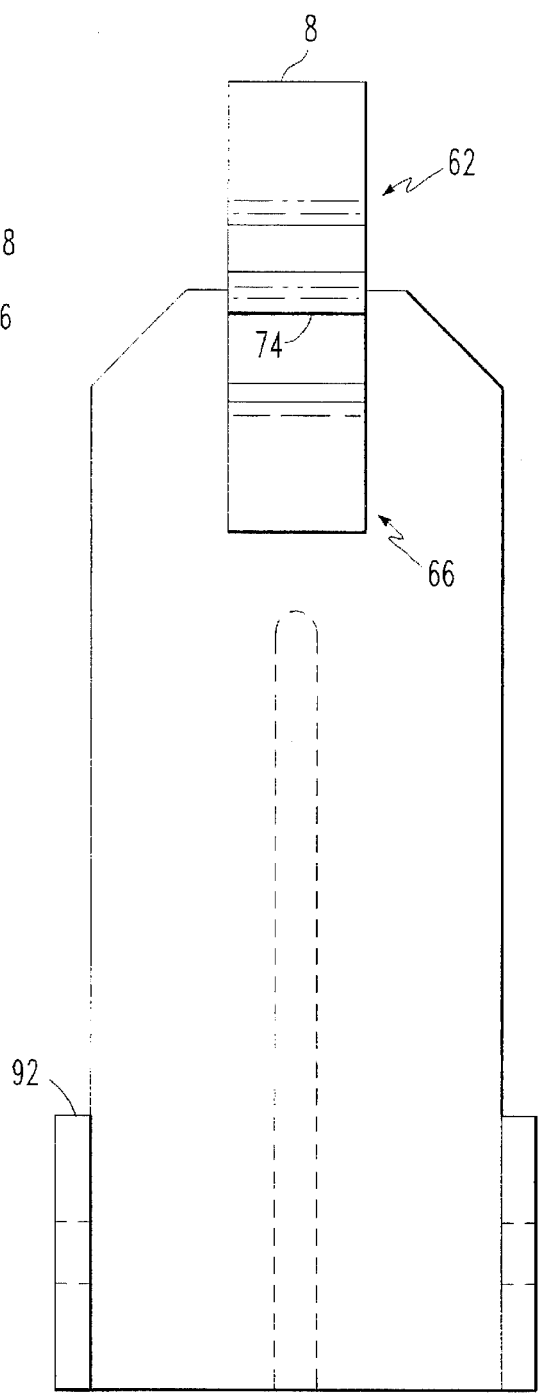
FIG.4
FIG.5

PRINTED CIRCUIT BOARD EDGE CONNECTOR INCLUDING LATCHING AND EJECTMENT MECHANISM

BACKGROUND OF THE INVENTION

1. Field of the Invention

The present invention relates to electrical connectors and more particularly to electrical connectors for use with printed circuit boards.

2. Brief Description of Prior Developments

Printed circuit boards are equipped with conductive pads. Such circuit boards fit edgewise to engage slots in connector assemblies which are equipped with a plurality of resilient terminals. These terminals engage the pads on the circuit board to achieve electrical connection between the assembly and the circuit board. Various means have been suggested for latching and ejecting the circuit board from the assembly. Problems have, however, continued with regard to the ease of ejectment and the security of the latching.

SUMMARY OF THE INVENTION

In this assembly there is on both ends of the assembly housing a mechanism which is pivotally connected to the housing and which has an upper arm and a lateral ejectment arm. At the top of the upper arm there is a resilient latch which engages a semi-circular medial recess at the edge of the circuit board and which extends back upwardly and outwardly to provide a convenient surface for disengaging the latch from the recess. When downward pressure is applied to this surface, the upper arm is pivoted downwardly in a vertical arc. The lateral ejectment arm is then pivoted upwardly against the lower edge of the circuit board to thereby eject the circuit board.

BRIEF DESCRIPTION OF THE DRAWINGS

The circuit board edge connector assembly of the present invention is further described with reference to the accompanying drawings in which:

FIG. 1 is a plan bottom view of the assembly;

FIG. 2 is a side elevational view of the assembly in which the circuit board is engaged and shown in broken lines;

FIG. 4 is an enlarged side view of only the latch mechanism;

FIG. 5 is an end view of the latch mechanism shown in FIG. 4;

DETAILED DESCRIPTION OF THE PREFERRED EMBODIMENT

Figure 3:
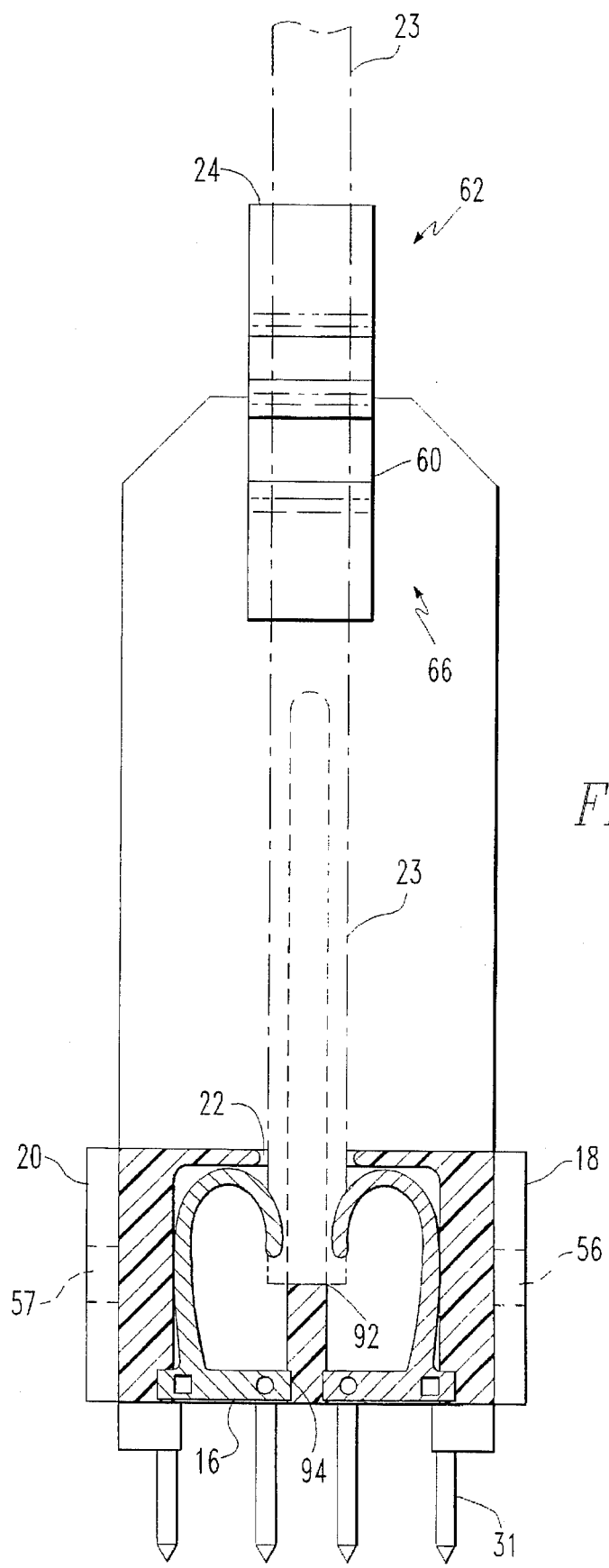
FIG. 3 is a vertical cross sectional view of the assembly taken through line III—III in FIG. 2.
Figure 6:
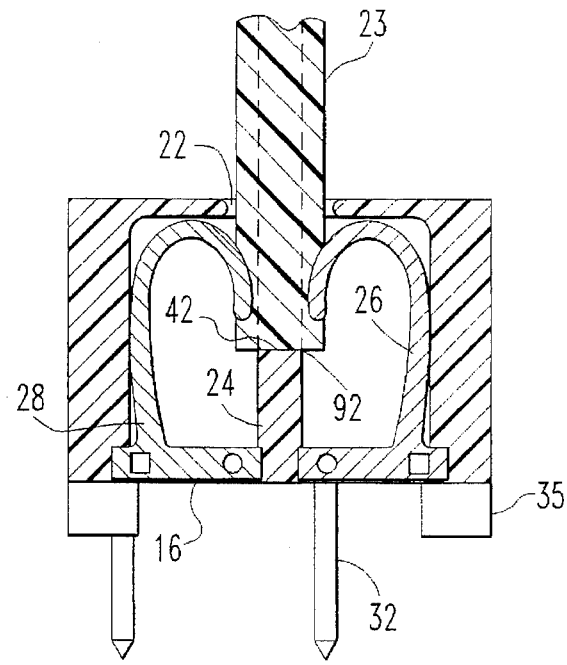
FIG. 6 is an enlarged cross sectional view taken through line VI—VI in FIG. 2.
Figure 7:
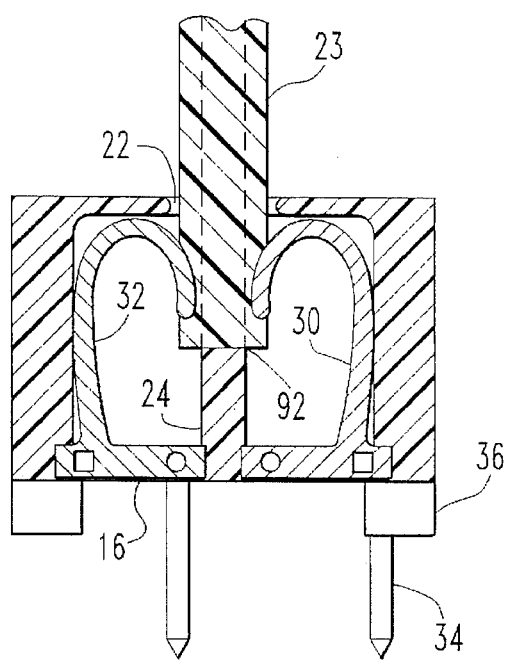
FIG. 7 is an enlarged cross sectional view of the latch mechanism taken through line VII—VII in FIG. 2.

Referring to the drawings, the assembly of the present invention includes a molded insulative housing shown generally at numeral 10. This housing has a first end 12 and an opposed second end 14, a top side 15 and a bottom side 16, as well as a first longitudinal side 18 and a second longitudinal side 20. Interposed between these longitudinal sides in the topside there is a longitudinal groove 22 for receiving the circuit board which is shown generally at numeral 23 and which rests on board rest 24. As is conventional, electrical contact with the circuit board is achieved though contact elements as at 26, 28, 30 and 32. The housing is connected to a mother circuit board 33 by means of leads (not shown) and is spaced from the board by stand offs as at 35 and 36. The circuit board 24 includes a first end 37 and an opposed second end 38 and a top edge 40 and a front edge 42. As is also conventional, the circuit board includes a number of conductive pads (not shown) by which it is connected to the contact elements.

On the first and second ends of the housing there are respectively a first latching mechanism shown generally at numeral 44 and a second latching mechanism shown generally at numeral 46. Each of these latching mechanisms include respectively an upper arm 48 and 49 each having respectively reinforcement ribs 50 and 51. The first and second latching mechanisms also include respectively lateral ejectment arms 52 and 54. Interposed between these arms on the first and second latching mechanisms are pivot shafts shown respectively at 56 and 57 and 58 and 59. These pivot shafts extend from the housing to engage apertures as at 60 (FIG. 4) in the latching mechanism. On the upper engagement arms of the first and second latching mechanisms there are flexible releases shown generally at numerals 62 and 64. These arms also include stop members shown respectively at 66 and 68 and are accommodated in abutting relation adjacent to the circuit board by means of recesses 70 and 72 in the circuit board. These latching mechanisms may advantageously be molded, one piece elements.

Referring particularly to FIG. 4, it will be seen that flexible release 62 comprises an inward leg 74 which extends inwardly from upper engagement arm 48 and which abuts against the circuit board at an inward terminal point 76 and then extends upwardly and outwardly in outward leg 78 which abuts against the recess 70 in an upwardly curved section 80 after which there is a downwardly curved section 82 where the outward leg comes out of contact with the edge of the recess.

At the terminal end of the release there is a downward pressure surface 84. On the ejectment arm of the latching mechanism there is an ejectment surface as at 92 (FIGS. 3 and 4) which bears against the lower edge of the circuit board. There are also slots 94 and 96 in the bottom side of the housing to accommodate the pivoting section of the ejectment arms. When downward pressure is applied to the downward pressure surface 84 of the release, the latching mechanism pivots on pivot shaft 56 and 57 in a vertical arc so as to cause this ejectment surface to move the circuit board upwardly and eject it from the assembly. It will be understood that the flexible release 62 and the stop 66 are constructed from resilient materials. In the positions shown they are in their compressed positions as when they engage the recess 70 in the circuit board. When they are disengaged from the recess, the release expands upwardly. The stop 66 is fixed to upper arm at its lower end 98 but at its upper end 100 it is not fixed so that when it is disengaged from the recess it will expand so that upper end 100 moves away from the upper arm.

It will be understood that the construction and operation of the second latching mechanism and its flexible release is essentially identical to that described above with regard to the first latching mechanism and its flexible release except that the two latching means are mirror images of each other.

It will be appreciated that a means have been described for latching a circuit board to a connector assembly in which it is also possible to quickly and easily eject the circuit board.

While the present invention has been described in connection with the preferred embodiments of the various FIGS., it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. An insertion and ejection printed circuit board edge connector assembly for a printed circuit board having opposed first and second end and top and front edges comprising:

(a) an elongated housing having opposed ends and longitudinal sides and a bottom side and a longitudinal card receiving groove interposed between said longitudinal sides such that the front edge of the circuit board is receivable in said card receiving groove; and (b) at least a first latching means having an upper engagement arm and a lateral ejectment arm and being attached to the housing at a pivot point so as to be pivotable in a vertical arc and having flexible attachment means for releaseability connecting the upper engagement arm to the first end of the circuit board and the flexible attachment means engages a recess in the first end of the circuit board and the flexible attachment means comprises an inward leg which extends from the engagement arm to abut at an inward terminal point against said end of the circuit board in said recess and then extends outwardly in an outward leg to an outward terminal end and there is a downward pressure surface at said outward terminal end of the outward leg such that when force is exerted on the downward pressure surface the outward leg is displaced to allow the engagement arm to be pivoted downwardly in said vertical arc.

2. The assembly of claim 1 wherein the ejectment arm has an upper ejectment surface and when the engagement arm is pivoted downwardly the upper ejectment surface of the ejectment arm bears against the bottom edge of the card.

3. The assembly of claim 1 wherein the vertical area is generally parallel to the longitudinal groove of the housing.

4. The assembly of claim 1 wherein the outward leg is in a continuously abutting relation against at least part of the recess.

5. The assembly of claim 1 wherein the pivot point is on at least one of the lateral walls of the housing.

6. The assembly of claim 1 the longitudinal groove in the housing extends downwardly through the bottom side of the housing to form a slot to allow the ejectment arm to pivot therethrough.

7. The assembly of claim 6 wherein the longitudinal groove extends downwardly through the bottom side of the housing adjacent the ends of the housing.

8. The assembly of claim 1 wherein said recess is positioned medially between the top and bottom edges of the circuit board.

9. The assembly claim 7 wherein said recess is generally semi-circular in shape.

10. The assembly of claim 1 wherein from a position vertically below the inward leg of the flexible release on the engagement arm a stop member extends inwardly toward the semi-circular recess.

11. The assembly of claim 10 wherein the stop member abuts the first end of the circuit board and then extends outwardly and downwardly in continuously abutting relation against at least part of the recess.

12. The assembly of claim 1 wherein there is a second latching means having an upper engagement arm and a lateral ejectment arm and being attached to the housing at a pivot point so as to be pivotable in a vertical arc generally parallel to the longitudinal slot of the housing and flexible attachment means for releasably fixing the upper engagement arm to the second end of the circuit board.

13. The assembly of claim 12 wherein the pivot point is on at least one of the lateral walls of the housing.

* * * * *